US012794419B2

(12) United States Patent
Ali et al.

(10) Patent No.: US 12,794,419 B2
(45) Date of Patent: Nov. 10, 2026

(54) COMPENSATING POWER AMPLIFIER DISTORTION

(71) Applicant: Nokia Technologies Oy, Espoo (FI)

(72) Inventors: Samad Ali, Oulu (FI); Oskari Tervo, Oulu (FI); Esa Tapani Tiirola, Oulu (FI); Kari Pekka Pajukoski, Oulu (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 455 days.

(21) Appl. No.: 18/556,768

(22) PCT Filed: Apr. 25, 2022

(86) PCT No.: PCT/EP2022/060809
§ 371 (c)(1),
(2) Date: Oct. 23, 2023

(87) PCT Pub. No.: WO2022/229046
PCT Pub. Date: Nov. 3, 2022

(65) Prior Publication Data

US 2024/0223135 A1 Jul. 4, 2024

(30) Foreign Application Priority Data

Apr. 30, 2021 (FI) ..................................... 20215502

(51) Int. Cl.
*H03F 1/32* (2006.01)
*H04B 1/04* (2006.01)

(52) U.S. Cl.
CPC ......... *H03F 1/3247* (2013.01); *H04B 1/0475* (2013.01); *H03F 2200/451* (2013.01)

(58) Field of Classification Search
CPC ............ H03F 1/3247; H03F 2200/451; H04B 1/0475

(Continued)

(56) References Cited

U.S. PATENT DOCUMENTS 9,735,857 B2 8/2017 Abouelenin
10,454,427 B2 10/2019 Ma et al.

(Continued)

FOREIGN PATENT DOCUMENTS

EP 2293435 A1 3/2011
WO 2022/073615 A1 4/2022

OTHER PUBLICATIONS

Li, et al., "Complex-Valued Pipelined Chebyshev Functional Link Recurrent Neural Network for joint compensation of wideband transmitter distortions and Impairments", IEEE Access, Sep. 1, 2020 (Year: 2020).*

(Continued)

*Primary Examiner* — Hafizur Rahman
(74) *Attorney, Agent, or Firm* — BURR & FORMAN LLP

(57) ABSTRACT

Disclosed is a method comprising selecting (401), by a base station, a power amplifier distortion model from a set of power amplifier distortion models, wherein the power amplifier distortion model comprises a pre-trained machine learning model configured to compensate power amplifier distortion. The method further comprises receiving (402), by the base station, one or more uplink data transmissions from a terminal device, and compensating (403), by the base station, at least a part of the power amplifier distortion from the one or more uplink data transmissions based at least partly on the power amplifier distortion model.

17 Claims, 6 Drawing Sheets

(58) Field of Classification Search
USPC .......................................................... 330/149
See application file for complete search history.

(56) References Cited

U.S. PATENT DOCUMENTS

| | | | |
|---|---|---|---|
| 10,581,469 | B1 | 3/2020 | O'shea et al. |
| 2011/0293051 | A1 | 12/2011 | Lozhkin |
| 2014/0037018 | A1 | 2/2014 | Kwon |
| 2017/0279640 | A1 | 9/2017 | Yang et al. |
| 2019/0058545 | A1 | 2/2019 | Chen et al. |
| 2019/0190552 | A1 | 6/2019 | Sagi et al. |

OTHER PUBLICATIONS

"3rd Generation Partnership Project; Technical Specification Group Radio Access Network; NR; Physical channels and modulation (Release 16)", 3GPP TS 38.211, V16.3.0, Sep. 2020, pp. 1-133.

"3rd Generation Partnership Project; Technical Specification Group Radio Access Network; NR; Physical layer procedures for data (Release 16)", 3GPP TS 38.214, V16.3.0, Sep. 2020, pp. 1-166.

"3rd Generation Partnership Project; Technical Specification Group Radio Access Network; NR; User Equipment (UE) radio transmission and reception; Part 2: Range 2 Standalone (Release 16)", 3GPP TS 38.101-2, V16.5.0, Sep. 2020, pp. 1-181.

"3rd Generation Partnership Project; Technical Specification Group Radio Access Network; NR; Radio Resource Control (RRC) protocol specification (Release 16)", 3GPP TS 38.331, V16.2.0, Sep. 2020, pp. 1-921.

"3rd Generation Partnership Project; Technical Specification Group Radio Access Network; NR; Medium Access Control (MAC) protocol specification (Release 16)", 3GPP TS 38.321, V16.2.1, Sep. 2020, pp. 1-154.

"Network energy saving techniques", 3GPP TSG RAN WG1 #111, R1-2212129, Agenda item: 9.7.2, Qualcomm Incorporated, Nov. 14-18, 2022, 29 pages.

"Views on Rel-19 AI/ML for air interface", 3GPP TSG RAN Rel-19 workshop, RWS-230063, Agenda Item: 5, vivo, Jun. 15-16, 2023, 27 pages.

"Views on Network Energy Saving in Release 19", 3GPP TSG RAN Rel-19 workshop, RWS-230281, KDDI corporation, Jun. 15-16, 2023, 5 pages.

"Overview of RAN4-led Rel-19 topics", 3GPP TSG RAN meeting #101, RP-232383, Huawei, Sep. 11-15, 2023, 25 pages.

Mkadem et al., "Physically Inspired Neural Network Model for RF Power Amplifier Behavioral Modeling and Digital Predistortion", IEEE Transactions on Microwave Theory and Techniques, vol. 59, No. 4, Apr. 2011, pp. 913-923.

Dikmese et al., "Behavioral Modeling of Power Amplifiers with Modern Machine Learning Techniques", IEEE MTT-S International Microwave Conference on Hardware and Systems for 5G and Beyond (IMC-5G), Aug. 15-16, 2019, 3 pages.

Office Action received for corresponding Finnish Patent Application No. 20215502, dated Nov. 5, 2021, 7 pages.

Office Action received for corresponding Finnish Patent Application No. 20215502, dated Mar. 30, 2022, 3 pages.

International Search Report and Written Opinion received for corresponding Patent Cooperation Treaty Application No. PCT/EP2022/060809, dated Aug. 31, 2022, 16 pages.

Amiri et al., "Partitioned Distortion Mitigation in LTE Radio Uplink to Enhance Transmitter Efficiency", IEEE Transactions on Microwave Theory and Techniques, vol. 63, No. 8, Aug. 2015, pp. 2661-2671.

* cited by examiner

COMPENSATING POWER AMPLIFIER DISTORTION

RELATED APPLICATION

This application claims priority to PCT Application No. PCT/EP2022/060809, filed Apr. 25, 2022, which claims priority from FI application No. 20215502, filed on Apr. 30, 2021, each of which is incorporated herein by reference in its entirety.

FIELD

The following exemplary embodiments relate to wireless communication.

BACKGROUND

In a radio transmitter, there may be one or more nonlinear components, such as a power amplifier, which may cause distortions to transmitted signals. It is desirable to reduce the impact of distortions caused by power amplifiers.

SUMMARY

The scope of protection sought for various exemplary embodiments is set out by the independent claims. The exemplary embodiments and features, if any, described in this specification that do not fall under the scope of the independent claims are to be interpreted as examples useful for understanding various exemplary embodiments.

According to an aspect, there is provided an apparatus comprising at least one processor, and at least one memory including computer program code, wherein the at least one memory and the computer program code are configured, with the at least one processor, to cause the apparatus to: select a power amplifier distortion model from a set of power amplifier distortion models, wherein the power amplifier distortion model comprises a pre-trained machine learning model configured to compensate power amplifier distortion; receive one or more uplink data transmissions from a terminal device; and compensate at least a part of the power amplifier distortion from the one or more uplink data transmissions based at least partly on the power amplifier distortion model.

According to another aspect, there is provided an apparatus comprising means for: selecting a power amplifier distortion model from a set of power amplifier distortion models, wherein the power amplifier distortion model comprises a pre-trained machine learning model configured to compensate power amplifier distortion; receiving one or more uplink data transmissions from a terminal device; and compensating at least a part of the power amplifier distortion from the one or more uplink data transmissions based at least partly on the power amplifier distortion model.

According to another aspect, there is provided a method comprising selecting, by a base station, a power amplifier distortion model from a set of power amplifier distortion models, wherein the power amplifier distortion model comprises a pre-trained machine learning model configured to compensate power amplifier distortion; receiving, by the base station, one or more uplink data transmissions from a terminal device; and compensating, by the base station, at least a part of the power amplifier distortion from the one or more uplink data transmissions based at least partly on the power amplifier distortion model.

According to another aspect, there is provided a computer program comprising instructions for causing an apparatus to perform at least the following: select a power amplifier distortion model from a set of power amplifier distortion models, wherein the power amplifier distortion model comprises a pre-trained machine learning model configured to compensate power amplifier distortion; receive one or more uplink data transmissions from a terminal device; and compensate at least a part of the power amplifier distortion from the one or more uplink data transmissions based at least partly on the power amplifier distortion model.

According to another aspect, there is provided a computer readable medium comprising program instructions for causing an apparatus to perform at least the following: select a power amplifier distortion model from a set of power amplifier distortion models, wherein the power amplifier distortion model comprises a pre-trained machine learning model configured to compensate power amplifier distortion; receive one or more uplink data transmissions from a terminal device; and compensate at least a part of the power amplifier distortion from the one or more uplink data transmissions based at least partly on the power amplifier distortion model.

According to another aspect, there is provided a non-transitory computer readable medium comprising program instructions for causing an apparatus to perform at least the following: select a power amplifier distortion model from a set of power amplifier distortion models, wherein the power amplifier distortion model comprises a pre-trained machine learning model configured to compensate power amplifier distortion; receive one or more uplink data transmissions from a terminal device; and compensate at least a part of the power amplifier distortion from the one or more uplink data transmissions based at least partly on the power amplifier distortion model.

According to another aspect, there is provided an apparatus comprising at least one processor, and at least one memory including computer program code, wherein the at least one memory and the computer program code are configured, with the at least one processor, to cause the apparatus to: transmit, to a base station, a first indication indicating a capability to support power amplifier distortion compensation at the base station; wherein the first indication comprises at least one of: an identifier of a power amplifier comprised in the apparatus, an identifier of a power amplifier distortion model associated with the power amplifier, an identifier of a power amplifier model associated with the power amplifier, and/or one or more operating conditions associated with the power amplifier; and receive, from the base station, a second indication indicating to operate the power amplifier according to a reduced power backoff and/or a reduced maximum power reduction.

According to another aspect, there is provided an apparatus comprising means for: transmitting, to a base station, a first indication indicating a capability to support power amplifier distortion compensation at the base station; wherein the first indication comprises at least one of: an identifier of a power amplifier comprised in the apparatus, an identifier of a power amplifier distortion model associated with the power amplifier, an identifier of a power amplifier model associated with the power amplifier, and/or one or more operating conditions associated with the power amplifier; and receiving, from the base station, a second indication indicating to operate the power amplifier according to a reduced power backoff and/or a reduced maximum power reduction.

According to another aspect, there is provided a method comprising transmitting, by a terminal device, to a base station, a first indication indicating a capability to support power amplifier distortion compensation at the base station; wherein the first indication comprises at least one of: an identifier of a power amplifier comprised in the terminal device, an identifier of a power amplifier distortion model associated with the power amplifier, an identifier of a power amplifier model associated with the power amplifier, and/or one or more operating conditions associated with the power amplifier; and receiving, by the terminal device, from the base station, a second indication indicating to operate the power amplifier according to a reduced power backoff and/or a reduced maximum power reduction.

According to another aspect, there is provided a computer program comprising instructions for causing an apparatus to perform at least the following: transmit, to a base station, a first indication indicating a capability to support power amplifier distortion compensation at the base station; wherein the first indication comprises at least one of: an identifier of a power amplifier comprised in the apparatus, an identifier of a power amplifier distortion model associated with the power amplifier, an identifier of a power amplifier model associated with the power amplifier, and/or one or more operating conditions associated with the power amplifier; and receive, from the base station, a second indication indicating to operate the power amplifier according to a reduced power backoff and/or a reduced maximum power reduction.

According to another aspect, there is provided a computer readable medium comprising program instructions for causing an apparatus to perform at least the following: transmit, to a base station, a first indication indicating a capability to support power amplifier distortion compensation at the base station; wherein the first indication comprises at least one of: an identifier of a power amplifier comprised in the apparatus, an identifier of a power amplifier distortion model associated with the power amplifier, an identifier of a power amplifier model associated with the power amplifier, and/or one or more operating conditions associated with the power amplifier; and receive, from the base station, a second indication indicating to operate the power amplifier according to a reduced power backoff and/or a reduced maximum power reduction.

According to another aspect, there is provided a non-transitory computer readable medium comprising program instructions for causing an apparatus to perform at least the following: transmit, to a base station, a first indication indicating a capability to support power amplifier distortion compensation at the base station; wherein the first indication comprises at least one of: an identifier of a power amplifier comprised in the apparatus, an identifier of a power amplifier distortion model associated with the power amplifier, an identifier of a power amplifier model associated with the power amplifier, and/or one or more operating conditions associated with the power amplifier; and receive, from the base station, a second indication indicating to operate the power amplifier according to a reduced power backoff and/or a reduced maximum power reduction.

According to another aspect, there is provided a system comprising at least a base station and a terminal device. The terminal device is configured to: transmit, to the base station, a first indication indicating a capability to support power amplifier distortion compensation at the base station; wherein the first indication comprises at least one of: an identifier of a power amplifier comprised in the terminal device, an identifier of a power amplifier distortion model associated with the power amplifier, an identifier of a power amplifier model associated with the power amplifier, and/or one or more operating conditions associated with the power amplifier; and transmit one or more uplink data transmissions to the base station via the power amplifier comprised in the terminal device. The base station is configured to: receive the first indication from the terminal device; select a power amplifier distortion model from a set of power amplifier distortion models based at least partly on the first indication, wherein the power amplifier distortion model comprises a pre-trained machine learning model configured to compensate power amplifier distortion; receive the one or more uplink data transmissions from the terminal device; and compensate at least a part of the power amplifier distortion from the one or more uplink data transmissions based at least partly on the power amplifier distortion model.

According to another aspect, there is provided a system comprising at least a base station and a terminal device. The terminal device comprises means for: transmitting, to the base station, a first indication indicating a capability to support power amplifier distortion compensation at the base station; wherein the first indication comprises at least one of: an identifier of a power amplifier comprised in the terminal device, an identifier of a power amplifier distortion model associated with the power amplifier, an identifier of a power amplifier model associated with the power amplifier, and/or one or more operating conditions associated with the power amplifier; and transmitting one or more uplink data transmissions to the base station via the power amplifier comprised in the terminal device. The base station comprises means for: receiving the first indication from the terminal device; selecting a power amplifier distortion model from a set of power amplifier distortion models based at least partly on the first indication, wherein the power amplifier distortion model comprises a pre-trained machine learning model configured to compensate power amplifier distortion; receiving the one or more uplink data transmissions from the terminal device; and compensating at least a part of the power amplifier distortion from the one or more uplink data transmissions based at least partly on the power amplifier distortion model.

BRIEF DESCRIPTION OF THE DRAWINGS

In the following, various exemplary embodiments will be described in greater detail with reference to the accompanying drawings, in which.

DETAILED DESCRIPTION

The following embodiments are exemplifying. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

In the following, different exemplary embodiments will be described using, as an example of an access architecture to which the exemplary embodiments may be applied, a radio access architecture based on long term evolution advanced (LTE Advanced, LTE-A) or new radio (NR, 5G), without restricting the exemplary embodiments to such an architecture, however. It is obvious for a person skilled in the art that the exemplary embodiments may also be applied to other kinds of communications networks having suitable means by adjusting parameters and procedures appropriately. Some examples of other options for suitable systems may be the universal mobile telecommunications system (UMTS) radio access network (UTRAN or E-UTRAN), long term evolution (LTE, substantially the same as E-UTRA), wireless local area network (WLAN or Wi-Fi), worldwide interoperability for microwave access (WiMAX), Bluetooth®, personal communications services (PCS), ZigBee®, wideband code division multiple access (WCDMA), systems using ultra-wideband (UWB) technology, sensor networks, mobile ad-hoc networks (MANETs) and Internet Protocol multimedia subsystems (IMS) or any combination thereof.

Figure 1:
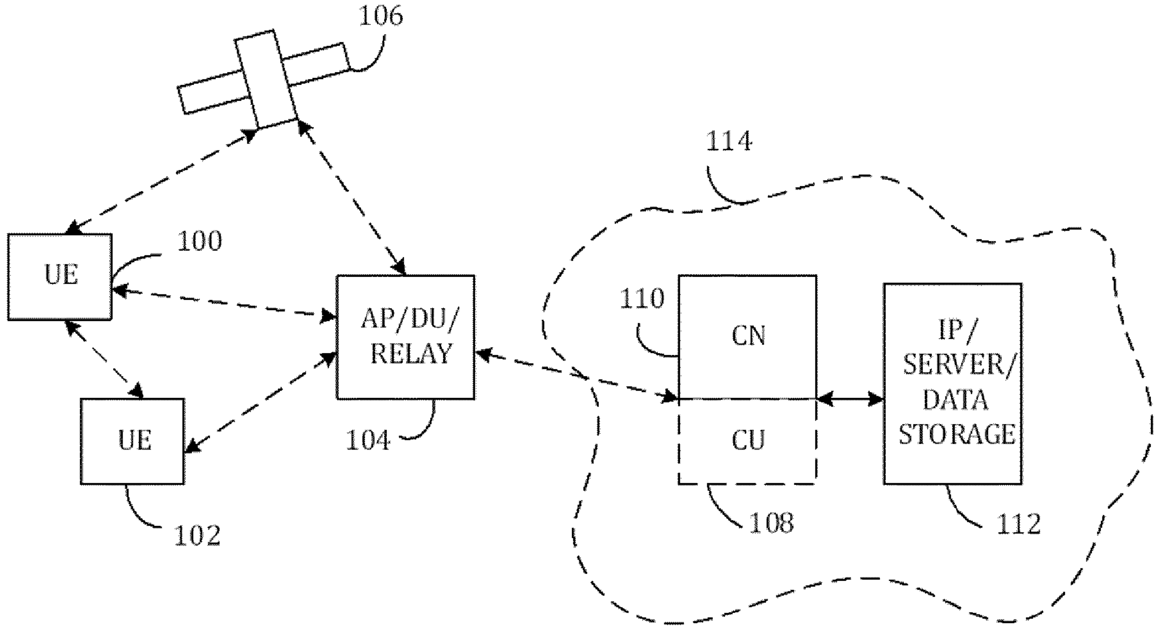
FIG. 1 illustrates an exemplary embodiment of a cellular communication network.

FIG. 1 depicts examples of simplified system architectures showing some elements and functional entities, all being logical units, whose implementation may differ from what is shown. The connections shown in FIG. 1 are logical connections; the actual physical connections may be different. It is apparent to a person skilled in the art that the system may also comprise other functions and structures than those shown in FIG. 1.

The exemplary embodiments are not, however, restricted to the system given as an example but a person skilled in the art may apply the solution to other communication systems provided with necessary properties.

The example of FIG. 1 shows a part of an exemplifying radio access network.

FIG. 1 shows user devices 100 and 102 configured to be in a wireless connection on one or more communication channels in a cell with an access node (such as (e/g)NodeB) 104 providing the cell. The physical link from a user device to a (e/g)NodeB may be called uplink or reverse link and the physical link from the (e/g)NodeB to the user device may be called downlink or forward link. It should be appreciated that (e/g)NodeBs or their functionalities may be implemented by using any node, host, server or access point etc. entity suitable for such a usage.

A communication system may comprise more than one (e/g)NodeB, in which case the (e/g)NodeBs may also be configured to communicate with one another over links, wired or wireless, designed for the purpose. These links may be used for signaling purposes. The (e/g) NodeB may be a computing device configured to control the radio resources of communication system it is coupled to. The NodeB may also be referred to as a base station, an access point or any other type of interfacing device including a relay station capable of operating in a wireless environment. The (e/g) NodeB may include or be coupled to transceivers. From the transceivers of the (e/g)NodeB, a connection may be provided to an antenna unit that establishes bi-directional radio links to user devices. The antenna unit may comprise a plurality of antennas or antenna elements. The (e/g)NodeB may further be connected to core network 110 (CN or next generation core NGC). Depending on the system, the counterpart on the CN side may be a serving gateway (S-GW, routing and forwarding user data packets), packet data network gateway (P-GW), for providing connectivity of user devices (UEs) to external packet data networks, or mobile management entity (MME), etc.

The user device (also called UE, user equipment, user terminal, terminal device, etc.) illustrates one type of an apparatus to which resources on the air interface may be allocated and assigned, and thus any feature described herein with a user device may be implemented with a corresponding apparatus, such as a relay node. An example of such a relay node may be a layer 3 relay (self-backhauling relay) towards the base station. There may be two relay modes: out-of-band relay, where the substantially same or different carriers may be defined for an access link and a backhaul link; and in-band-relay, where the substantially same carrier frequency or radio resources are used for both access and backhaul links. In-band relay may be seen as a baseline relay scenario. A relay node may be called an integrated access and backhaul (IAB) node. It may also have in-built support for multiple relay hops. IAB operation assumes a so-called split architecture having a central unit (CU) 108 and one or more distributed units (DUs) 104. An IAB node contains two separate functionalities: DU part of the IAB node facilitates the gNB (access node) functionalities in a relay cell, i.e. it serves as the access link; and a mobile termination (MT) part of the IAB node that facilitates the backhaul connection. A donor node (DU part) communicates with the MT part of the IAB node, and it has a wired connection to the CU, which has a connection to the core network. In the multihop scenario, the MT part (a child IAB node) communicates with a DU part of the parent IAB node.

The user device may refer to a portable computing device that includes wireless mobile communication devices operating with or without a subscriber identification module (SIM), including, but not limited to, the following types of devices: a mobile station (mobile phone), smartphone, personal digital assistant (PDA), handset, device using a wireless modem (alarm or measurement device, etc.), laptop and/or touch screen computer, tablet, game console, notebook, and multimedia device. It should be appreciated that a user device may also be a nearly exclusive uplink only device, of which an example may be a camera or video camera loading images or video clips to a network. A user device may also be a device having capability to operate in Internet of Things (IoT) network which is a scenario in which objects may be provided with the ability to transfer data over a network without requiring human-to-human or human-to-computer interaction. The user device may also utilize cloud. In some applications, a user device may comprise a small portable device with radio parts (such as a watch, earphones or eyeglasses) and the computation may be carried out in the cloud. The user device (or in some exemplary embodiments a layer 3 relay node) may be configured to perform one or more of user equipment functionalities. The user device may also be called a subscriber unit, mobile station, remote terminal, access terminal, user terminal, terminal device, or user equipment (UE) just to mention but a few names or apparatuses.

Various techniques described herein may also be applied to a cyber-physical system (CPS) (a system of collaborating computational elements controlling physical entities). CPS may enable the implementation and exploitation of massive amounts of interconnected ICT devices (sensors, actuators, processors microcontrollers, etc.) embedded in physical objects at different locations. Mobile cyber physical systems, in which the physical system in question may have inherent mobility, are a subcategory of cyber-physical systems. Examples of mobile physical systems include mobile robotics and electronics transported by humans or animals.

Additionally, although the apparatuses have been depicted as single entities, different units, processors and/or memory units (not all shown in FIG. 1) may be implemented.

5G may enable using multiple input—multiple output (MIMO) antennas, many more base stations or nodes than the LTE (a so-called small cell concept), including macro sites operating in co-operation with smaller stations and employing a variety of radio technologies depending on service needs, use cases and/or spectrum available. 5G mobile communications may support a wide range of use cases and related applications including video streaming, augmented reality, different ways of data sharing and various forms of machine type applications (such as (massive) machine-type communications (mMTC), including vehicular safety, different sensors and real-time control. 5G may be expected to have multiple radio interfaces, namely below 6 GHz, cmWave and mmWave, and also being integrable with existing legacy radio access technologies, such as the LTE. Integration with the LTE may be implemented, at least in the early phase, as a system, where macro coverage may be provided by the LTE, and 5G radio interface access may come from small cells by aggregation to the LTE. In other words, 5G may support both inter-RAT operability (such as LTE-5G) and inter-RI operability (inter-radio interface operability, such as below 6 GHz-cmWave, below 6 GHz-cmWave-mmWave). One of the concepts considered to be used in 5G networks may be network slicing in which multiple independent and dedicated virtual sub-networks (network instances) may be created within the substantially same infrastructure to run services that have different requirements on latency, reliability, throughput and mobility.

The current architecture in LTE networks may be fully distributed in the radio and fully centralized in the core network. The low latency applications and services in 5G may need to bring the content close to the radio which leads to local break out and multi-access edge computing (MEC). 5G may enable analytics and knowledge generation to occur at the source of the data. This approach may need leveraging resources that may not be continuously connected to a network such as laptops, smartphones, tablets and sensors. MEC may provide a distributed computing environment for application and service hosting. It may also have the ability to store and process content in close proximity to cellular subscribers for faster response time. Edge computing may cover a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system may also be able to communicate with other networks, such as a public switched telephone network or the Internet 112, or utilize services provided by them. The communication network may also be able to support the usage of cloud services, for example at least part of core network operations may be carried out as a cloud service (this is depicted in FIG. 1 by "cloud" 114). The communication system may also comprise a central control entity, or a like, providing facilities for networks of different operators to cooperate for example in spectrum sharing.

Edge cloud may be brought into radio access network (RAN) by utilizing network function virtualization (NFV) and software defined networking (SDN). Using edge cloud may mean access node operations to be carried out, at least partly, in a server, host or node operationally coupled to a remote radio head or a radio unit (RU), or a base station comprising radio parts. It may also be possible that node operations will be distributed among a plurality of servers, nodes or hosts. Carrying out the RAN real-time functions at the RAN side (in a distributed unit, DU 104) and non-real time functions in a centralized manner (in a central unit, CU 108) may be enabled for example by application of cloud-RAN architecture.

It should also be understood that the distribution of labour between core network operations and base station operations may differ from that of the LTE or even be non-existent. Some other technology advancements that may be used may be Big Data and all-IP, which may change the way networks are being constructed and managed. 5G (or new radio, NR) networks may be designed to support multiple hierarchies, where MEC servers may be placed between the core and the base station or nodeB (gNB). It should be appreciated that MEC may be applied in 4G networks as well.

5G may also utilize satellite communication to enhance or complement the coverage of 5G service, for example by providing backhauling. Possible use cases may be providing service continuity for machine-to-machine (M2M) or Internet of Things (IoT) devices or for passengers on board of vehicles, or ensuring service availability for critical communications, and future railway/maritime/aeronautical communications. Satellite communication may utilize geostationary earth orbit (GEO) satellite systems, but also low earth orbit (LEO) satellite systems, in particular mega-constellations (systems in which hundreds of (nano)satellites are deployed). At least one satellite 106 in the mega-constellation may cover several satellite-enabled network entities that create on-ground cells. The on-ground cells may be created through an on-ground relay node 104 or by a gNB located on-ground or in a satellite.

It is obvious for a person skilled in the art that the depicted system is only an example of a part of a radio access system and in practice, the system may comprise a plurality of (e/g)NodeBs, the user device may have an access to a plurality of radio cells and the system may also comprise other apparatuses, such as physical layer relay nodes or other network elements, etc. At least one of the (e/g)NodeBs or may be a Home(e/g)nodeB.

Furthermore, the (e/g)nodeB or base station may also be split into: a radio unit (RU) comprising a radio transceiver (TRX), i.e. a transmitter (TX) and a receiver (RX); one or more distributed units (DUs) that may be used for the so-called Layer 1 (L1) processing and real-time Layer 2 (L2) processing; and a central unit (CU) or a centralized unit that may be used for non-real-time L2 and Layer 3 (L3) processing. The CU may be connected to the one or more DUs for example by using an F1 interface. Such a split may enable the centralization of CUs relative to the cell sites and DUs, whereas DUs may be more distributed and may even remain at cell sites. The CU and DU together may also be referred to as baseband or a baseband unit (BBU). The CU and DU may also be comprised in a radio access point (RAP).

The CU may be defined as a logical node hosting higher layer protocols, such as radio resource control (RRC), service data adaptation protocol (SDAP) and/or packet data convergence protocol (PDCP), of the (e/g)nodeB or base station. The DU may be defined as a logical node hosting radio link control (RLC), medium access control (MAC) and/or physical (PHY) layers of the (e/g)nodeB or base station. The operation of the DU may be at least partly controlled by the CU. The CU may comprise a control plane (CU-CP), which may be defined as a logical node hosting the RRC and the control plane part of the PDCP protocol of the CU for the (e/g)nodeB or base station. The CU may further comprise a user plane (CU-UP), which may be defined as a logical node hosting the user plane part of the PDCP protocol and the SDAP protocol of the CU for the (e/g)nodeB or base station.

Cloud computing platforms may also be used to run the CU and/or DU. The CU may run in a cloud computing platform, which may be referred to as a virtualized CU (vCU). In addition to the vCU, there may also be a virtualized DU (vDU) running in a cloud computing platform. Furthermore, there may also be a combination, where the DU may use so-called bare metal solutions, for example application-specific integrated circuit (ASIC) or customer-specific standard product (CSSP) system-on-a-chip (SoC) solutions. It should also be understood that the distribution of labour between the above-mentioned base station units, or different core network operations and base station operations, may differ.

Additionally, in a geographical area of a radio communication system, a plurality of different kinds of radio cells as well as a plurality of radio cells may be provided. Radio cells may be macro cells (or umbrella cells) which may be large cells having a diameter of up to tens of kilometers, or smaller cells such as micro-, femto- or picocells. The (e/g) NodeBs of FIG. 1 may provide any kind of these cells. A cellular radio system may be implemented as a multilayer network including several kinds of cells. In multilayer networks, one access node may provide one kind of a cell or cells, and thus a plurality of (e/g) NodeBs may be needed to provide such a network structure.

For fulfilling the need for improving the deployment and performance of communication systems, the concept of "plug-and-play" (e/g)NodeBs may be introduced. A network which may be able to use "plug-and-play" (e/g)NodeBs, may include, in addition to Home (e/g)NodeBs (H(e/g) nodeBs), a home node B gateway, or HNB-GW (not shown in FIG. 1). A HNB Gateway (HNB-GW), which may be installed within an operator's network, may aggregate traffic from a large number of HNBs back to a core network.

A power amplifier (PA) is a component that is used for increasing the magnitude of power of a given input signal in a radio transmitter. It is desirable to transmit a signal as efficiently as possible in order to reduce power consumption, while also keeping the signal distortion as small as possible. However, these two desirable features may contradict one another, and thus a trade-off between them may be needed. The efficiency of a power amplifier may be defined as the percentage of power that the power amplifier uses for amplification in relation to the total direct current power consumed by the power amplifier. At higher power levels, power amplifiers may experience nonlinearity regarding the relationship between the input and output of the power amplifier, and thus distortion may be introduced to the output signal of the power amplifier. This distortion may be referred to as power amplifier distortion.

Figure 2A:
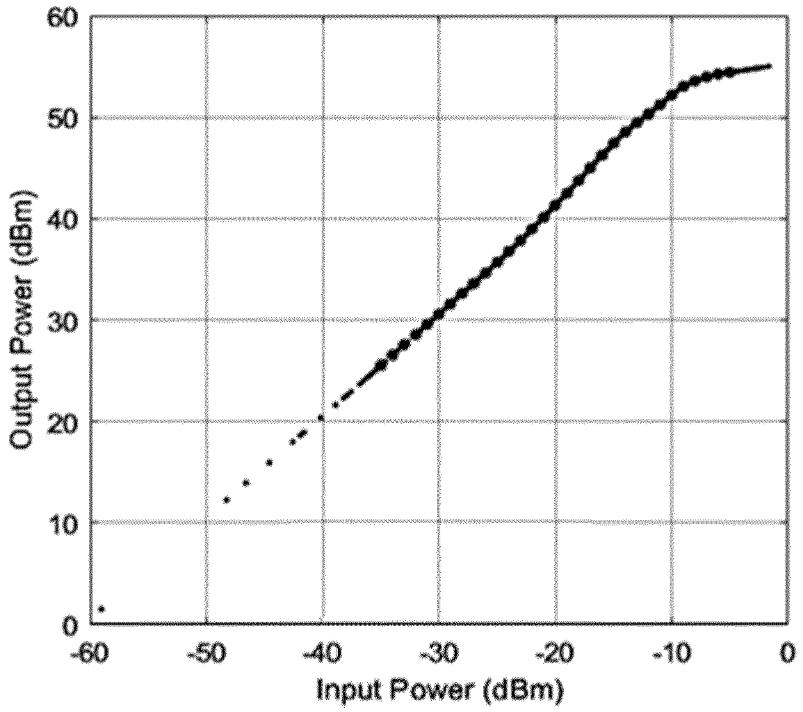
FIG. 2A illustrates an example of amplitude distortion for a power amplifier.
Figure 2B:
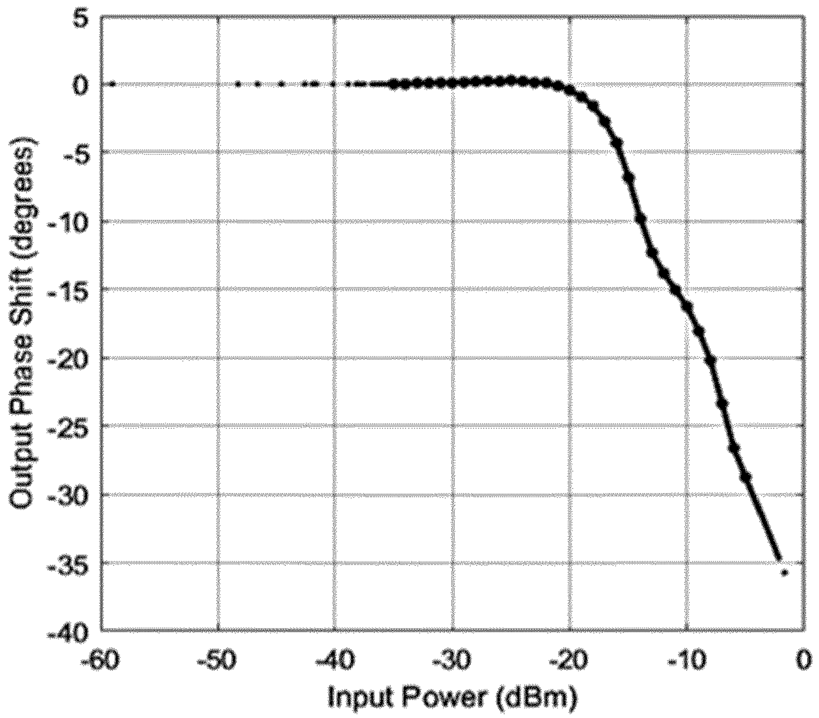
FIG. 2B illustrates an example of phase distortion for a power amplifier.

FIGS. 2A and 2B illustrate one example of the amplitude and phase distortions, respectively, for a power amplifier. In FIG. 2A, it can be seen that the increase in the output power is not a linear function of the input power at higher power levels. In FIG. 2B, it can be seen that the phase starts to shift at higher power levels.

Techniques such as power backoff may be used to maintain the power amplifier in the linear region. Power backoff in a power amplifier means a power reduction below the saturation point (i.e. below the maximum output power) of the power amplifier in order to enable the power amplifier to operate in the linear region even if there is a slight increase in the input power level. Power amplifiers may operate close to the saturation point, where efficiency is the highest. However, at this point, a small increase in input power may push the power amplifier from the linear mode to the saturated mode. Thus, in order to ensure that the power amplifier operates in the linear region, the power level may be lowered from the point of maximum efficiency. The value of this power level reduction is the power backoff. This means that the higher the power backoff, the smaller is the actual transmit power and coverage. Power backoff may be used, because the input power level is not constant and may vary significantly. This is the case for example in the case of multicarrier waveform such as orthogonal frequency division multiplexing (OFDM), and/or in the case of higher order modulation such as 16-state quadrature amplitude modulation (16QAM), 64-state quadrature amplitude modulation (64QAM), or higher.

This variation may be characterized by the peak-to-average power ratio (PAPR). The higher the PAPR, the more there are variations in the input power levels, which means that more power backoff may be needed to ensure operation in the linear region. PAPR varies also with the modulation scheme, so that lower-order modulations have lower PAPR, and thus use smaller power backoff.

A maximum power reduction (MPR) value may be predefined for example for a given modulation. The MPR is the allowed reduction of the maximum output power level, which the UE can use for example for a given modulation scheme, combination of modulation schemes (or modulation orders), and/or resource block allocation. Thus, the UE may determine an MPR-adjusted maximum output power, which may be a minimum requirement for maximum output power. Thus, for a given set of conditions (for example a modulation scheme, and/or other conditions), the UE may determine an MPR-adjusted maximum output power, which may be defined, for example, as the UE power class (e.g. 23 dBm) subtracted by the MPR. Thus, a higher MPR for the UE results in a lower maximum output power for the UE. Accordingly, a lower MPR for the UE results in a higher maximum output power for the UE.

Increasing the power backoff may result in reduced efficiency and increased power consumption at the power amplifier, and thus limited coverage. Therefore, either a larger power amplifier is selected in the design, or transmission times increase for a given amount of data due to lower spectral efficiency. Thus, it may be beneficial to reduce power backoff in order to enable lower power consumption and improved coverage. However, if the power backoff is decreased, the distortion caused by the PA non-linearities increases, which may increase the signal error vector magnitude (EVM) above the tolerable limit for the modulation used. For example, higher order modulations may be EVM-limited, which means that the power backoff is made so large that the EVM requirement is met. There may be different UE transmitter requirements that the UE needs to fulfill. These requirements may include EVM, adjacent channel leakage ratio (ACLR), occupied channel bandwidth (OCB), and/or in-band emissions (IBE). EVM may be the first limiting requirement of these requirements. In other words, if the EVM requirement is relaxed and backoff decreased, then the other requirements may still be fulfilled. The higher the modulation, the higher the EVM requirement.

In a UE transmitter (operating for example at mmWave frequencies), the power amplifier architecture may be based on complementary metal oxide semiconductor (CMOS) technology, which may provide limited transmit power, low power amplifier efficiency, and low linearity. Based on CMOS technology, a high backoff of approximately 10 dB may be needed for meeting the EVM requirements, or other requirements such as IBE or OCB. This may limit the coverage and increase the UE power consumption. The power added efficiency (PAE) may be just a few percentages, which means that such an antenna array may also have a high power dissipation.

In other words, there is a challenge in how to increase the transmit power in a way that EVM requirements (or other requirements) are fulfilled. This may limit the achievable coverage for the corresponding waveform and/or modulation schemes.

In order to compensate the distortion introduced by the power amplifier, it may be beneficial to characterize the power amplifier's nonlinear behavior and/or the inverse of that behavior. Power amplifiers may be modeled mathematically based on various parameters to describe, or predict, the nonlinear behavior of the power amplifier. The construction of a mathematical power amplifier model may comprise selecting a model structure and then estimating the model parameters. Some examples of power amplifier model structures may be memoryless nonlinearity models, such as the Saleh model, Rapp model and polynomial model, and nonlinearity models with memory, such as the Volterra series, Wiener model, Hammerstein model and the Wiener-Hammerstein model. Different power amplifier models may have different effects on the distortion compensation. By identifying an accurate model for a given power amplifier, linearization performance may be improved.

Digital predistortion (DPD) is a linearization technique that may be used to improve the linearity of a power amplifier. In DPD, a predistorter unit may be used to predistort the input signal that is fed to the power amplifier, for example to modify the amplitude and/or phase of the input signal, and thus reverse the nonlinearity introduced by the power amplifier, given that an accurate model for the nonlinearity of the power amplifier is used. In DPD, the predistorter unit may be implemented in the digital baseband domain. Furthermore, adaptive digital predistortion techniques may be used to adjust to changes in the power amplifier model caused for example by aging effects of the power amplifier, and to update the predistorter accordingly. Adaptive digital predistortion may comprise one or more of the following steps: identifying the power amplifier model, estimating the parameters of the identified power amplifier model, and/or estimating the predistortion parameters to be used by the predistorter unit for compensating the nonlinearity of the power amplifier based on the identified power amplifier model.

However, the DPD predistorter units are running complex algorithms, which consume a large amount of power and computational resources. Therefore, DPD may not be feasible in some UE transmitters due to the high processing burden, for example when considering wide TX bandwidth and/or high number of antennas per power amplifier (i.e. massive MIMO). On the other hand, without DPD, the transmitted signal may be distorted. Therefore, it may be desirable to have a PA distortion compensation unit at the receiver side, for example in a gNB, which has more computational power than the UE.

Some exemplary embodiments may apply machine learning for power amplifier distortion compensation at the receiver based on power amplifier distortion models that are learned in an offline manner. In some exemplary embodiments, power amplifier distortion may be compensated at the receiver, while the power amplifier in the transmitter is operating in a non-linear region. The receiver may select a pre-trained, i.e. previously trained, power amplifier distortion model from a set of pre-trained power amplifier distortion models, which have been trained offline for example by using supervised learning.

Supervised learning is an area of machine learning that may be used for learning a function that maps an input to an output based on exemplary input-output pairs, which may be referred to as labelled training data. In other words, in supervised learning, the desired outputs of the inputs are known. In the case of power amplifier distortion compensation, this means that the exact output signal for any input signal is known and the training process can be performed. The training process may be performed by using, for example, a linear regression algorithm or an artificial neural network. For example, a feedforward neural network may be suitable for a power amplifier without memory, whereas for power amplifiers with memory it may be beneficial to select a recurrent neural network architecture such as long short term memory (LSTM), which is suitable for modeling sequential data. The training may be performed in an offline manner, which means that different models with different hyper-parameters are trained until the model is performing sufficiently well. The hyper-parameters may comprise, for example, the number of layers for an artificial neural network, the number of neurons per layer, activation functions, etc. Then, the trained model is saved for example to a database, from which the model may be deployed for performing power amplifier distortion compensation.

Figure 3:
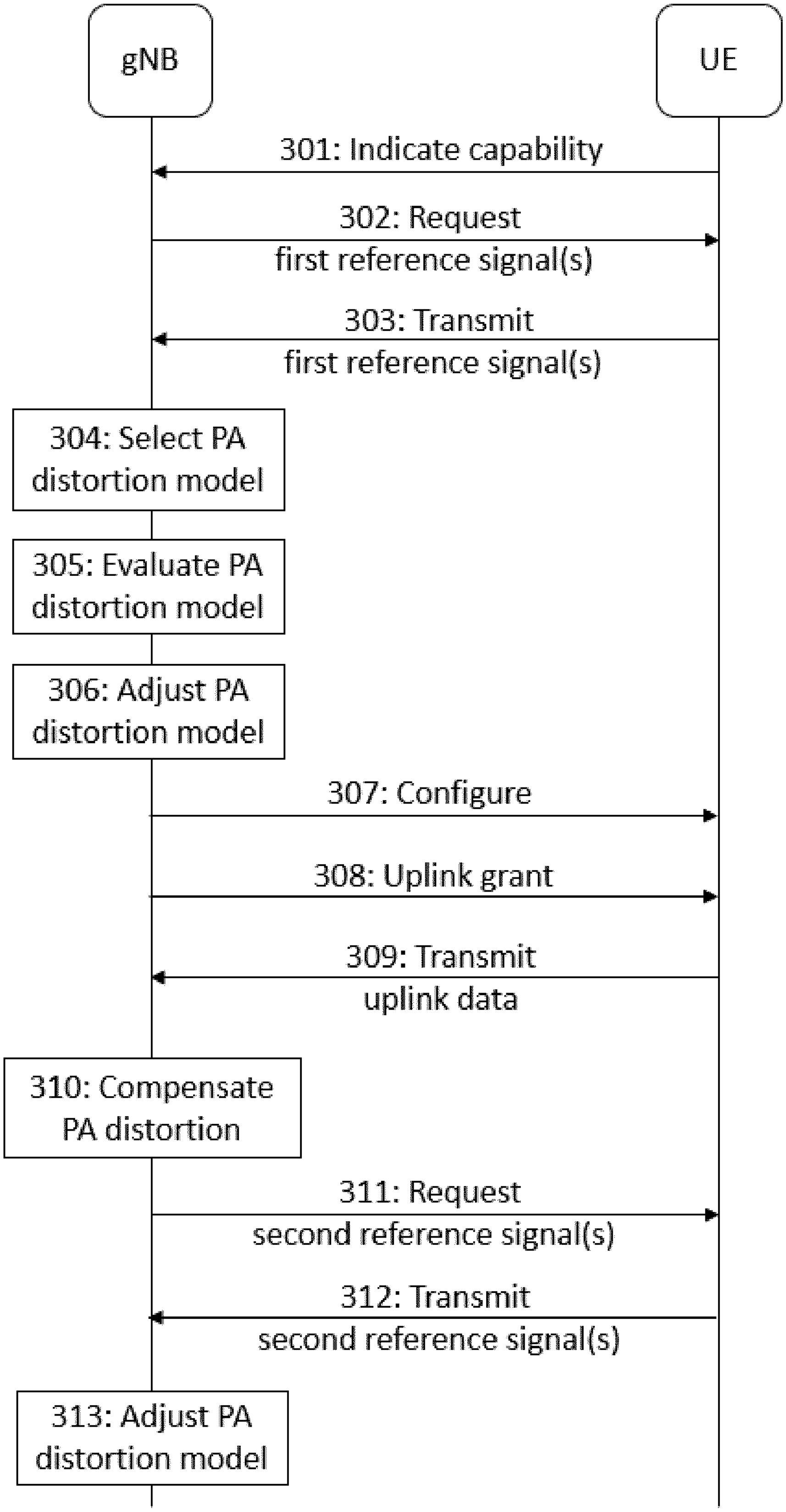
FIG. 3 illustrates a signaling diagram according to an exemplary embodiment.

FIG. 3 illustrates a signaling diagram according to an exemplary embodiment. In this exemplary embodiment, a base station such as a gNB has access to a set of PA distortion models, which comprise pre-trained machine learning models that are configured to compensate PA distortion for various PA models at different operating conditions, such as various frequency bands, temperatures, power supply voltages, and/or bias voltages. There may also be different PA distortion models for different vendors. The set of PA distortion models may also comprise different parameters for different cases of UE TX bandwidth. The set of PA distortion models may be pre-trained to a certain level of accuracy to be used at the gNB. This enables the gNB to have the capability to compensate, or remove, UE PA distortions at the receiver side (i.e. at the gNB). For example, the set of PA distortion models may be comprised in an internal database of the gNB, or in an external database.

Referring to FIG. 3, the UE may initially operate in a power backoff mode (i.e. without receiver-based PA distortion compensation). The UE indicates 301 to the gNB a capability for supporting receiver-based PA distortion compensation at the gNB. For example, the capability may comprise transmitting training signals from the UE to the gNB to support machine learning at the gNB, and/or adjusting the transmit power of the UE. The capability may be indicated by implicit or explicit signaling. For example, the capability signaling 301 may comprise a PAModelName message and/or a PAWorkingConditions message.

Alternatively, the PAModelName message and/or the PAWorkingConditions message may be transmitted separately from the indication 301 via other higher layer signaling. For example, the gNB may transmit a reply message to the UE in response to the indication 301 to confirm that the gNB is capable of receiver-based PA distortion compensation, and/or to request further information, such as the PAModelName message and/or the PAWorkingConditions message.

The PAModelName message may indicate a name or other identifier of a power amplifier comprised in the UE transmitter, or a name or other identifier of a PA distortion model or PA model associated with the power amplifier comprised in the UE transmitter. The PAWorkingConditions message may indicate one or more operating conditions, such as a frequency band, a temperature, a power supply voltage, and/or a bias voltage associated with the power amplifier of the UE transmitter.

If a suitable PA distortion model is not found for example based on the capability signaling 301, then the gNB may transmit a negative response to the UE for example with a TransmitWithBackoff message, which indicates the UE to continue transmission in power backoff mode. Alternatively, no negative response may be transmitted from the gNB to the UE, in which case the UE by default continues in the current power backoff mode unless it is instructed to change the mode.

On the other hand, if the gNB is capable of compensating the PA distortion (for example at least one suitable PA distortion model is found corresponding to the PAModelName message and/or the PAWorkingConditions message), then the gNB transmits 302 a message, such as an uplink grant, to the UE for scheduling transmission of one or more first reference signals from the UE to the gNB. The one or more first reference signals comprise a pre-defined signal that is known by the gNB. The one or more first reference signals may be uplink transmissions, such as physical uplink shared channel (PUSCH) transmissions, which comprise an at least partially known transmission block, and/or a pre-defined output backoff (OBO) for example for different OFDM symbols or single-carrier frequency-division multiplexing (SC-FDM) symbols.

The UE transmits 303 the one or more first reference signals to the gNB via the power amplifier comprised in the UE transmitter. For example, the UE may transmit multiple consecutive first reference signals in a row. The one or more first reference signals comprise the pre-defined signal, which is distorted by PA distortion caused by the UE power amplifier. Since the original reference signal is known by the gNB, the gNB can identify the PA distortion by comparing the received one or more first reference signals with the original reference signal known by the gNB.

The gNB selects 304 a PA distortion model from the set of PA distortion models based at least partly on the PAModelName message, the PAWorkingConditions message, and/or the one or more first reference signals. For example, if a PAModelName message is provided to the gNB, then the PA distortion model may be selected based on the PAModelName message. Alternatively, if no PAModelName message is provided to the gNB, then the PA distortion model may be selected based at least partly on the one or more first reference signals received from the UE. For example, the gNB may input the one or more first reference signals to some or all of the pre-trained machine learning models that are available, and select the model with the best performance for compensating the PA distortion from the one or more first reference signals.

The gNB evaluates 305 the performance of the selected PA distortion model based at least partly on the received one or more first reference signals. For example, the gNB may input the received one or more first reference signals to the selected PA distortion model, and evaluate the deviation between the output of the selected PA distortion model and the ideal signal, i.e. the original reference signal known by the gNB.

If the gNB determines, based on the evaluating 305, that the performance of the selected PA distortion model is not satisfactory, then the gNB may adjust 306 the selected PA distortion model by re-training at least a part of the pre-trained machine learning model based at least partly on the one or more first reference signals in order to improve the performance of the selected PA distortion model.

When the gNB determines that the performance of the PA distortion model is satisfactory for example based on a pre-defined accuracy threshold, the gNB transmits 307 an indication to the UE for configuring the UE to operate the power amplifier according to a reduced power backoff and/or a reduced MPR at the UE. The reduced power backoff and/or reduced MPR causes higher distortions to transmitted signals, but it improves the efficiency of the power amplifier. The configuration may be indicated for example in an RRC reconfiguration message. The configuration may be a semi-persistent allowance, or it may be limited to certain signal (s), for example triggered by a certain downlink control information (DCI) format.

The gNB transmits 308 a message, for example an uplink grant, to the UE for triggering and scheduling one or more uplink data transmissions from the UE to the gNB according to the reduced power backoff and/or the maximum power reduction. The UE determines the OBO and/or MPR according to the reduced power backoff and/or the reduced MPR, and transmits 309 the one or more uplink data transmission to the gNB via the power amplifier according to the reduced power backoff and/or the reduced MPR. The one or more uplink data transmissions are distorted by power amplifier distortion caused by the UE power amplifier. The reduced power backoff and/or reduced MPR may involve also relaxation of other UE transmitter requirements, for example higher EVM allowance and/or relaxed in-band emissions.

Upon receiving 309 the one or more uplink data transmissions from the UE, the gNB performs 310 PA distortion compensation on the received one or more uplink data transmissions. For example, the gNB may input the received one or more uplink data transmissions to the selected PA distortion model, which compensates the PA distortion, or at least a part of the PA distortion, from the received one or more uplink data transmissions. The compensated signal for a given uplink data transmission is then provided to the gNB as output from the selected PA distortion model.

The gNB may request 311 the UE to transmit 312 one or more second reference signals (i.e. one or more new reference signals) to the gNB via the power amplifier for re-evaluating the performance of the selected PA model. If the gNB determines that the performance of the selected PA distortion model is not satisfactory based on the re-evaluating, then the gNB may adjust 313 the selected PA distortion model by re-training at least a part of the pre-trained machine learning model based on the one or more second reference signals received from the UE. After the adjusting 313, the gNB may use the selected PA distortion model to compensate PA distortion for example from additional uplink data transmissions received from the UE.

In some exemplary embodiments, the reference signals 303, 312, and the requests 302, 311 for the reference signals may not be needed.

Figure 4:
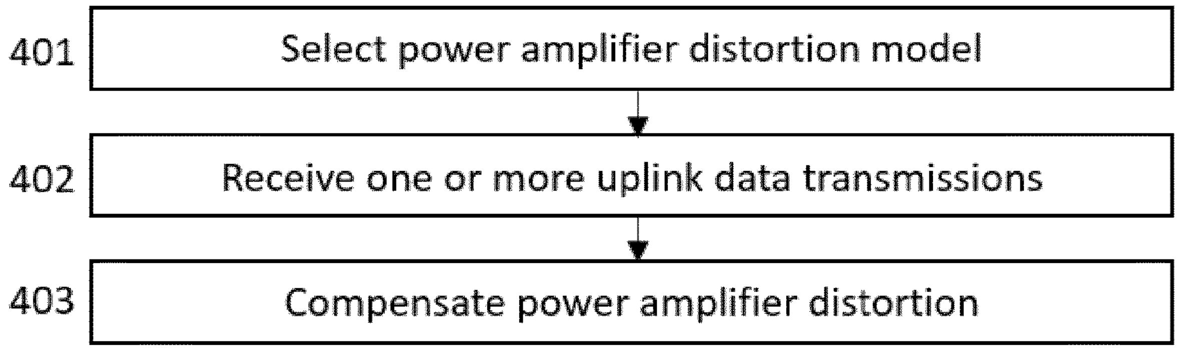
FIGS. 4-5 illustrate flow charts according to some exemplary embodiments.

FIG. 4 illustrates a flow chart according to an exemplary embodiment. The functions illustrated in FIG. 4 may be performed by an apparatus such as, or comprised in, a base station. Referring to FIG. 4, a power amplifier distortion model is selected 401 from a set of power amplifier distortion models, wherein the power amplifier distortion model comprises a pre-trained machine learning model configured to compensate power amplifier distortion. One or more uplink data transmissions are received 402 from a terminal device. At least a part of the power amplifier distortion is compensated 403 from the one or more uplink data transmissions based at least partly on the power amplifier distortion model.

Figure 5:
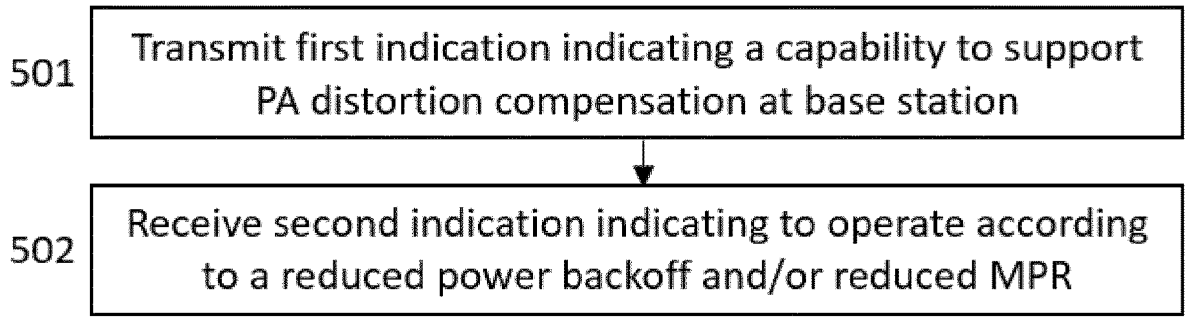

FIG. 5 illustrates a flow chart according to an exemplary embodiment. The functions illustrated in FIG. 5 may be performed by an apparatus such as, or comprised in, a UE. Referring to FIG. 5, a first indication is transmitted 501 to a base station to indicate a capability to support power amplifier distortion compensation at the base station. The first indication comprises at least one of: an identifier of a power amplifier comprised in the apparatus, an identifier of a power amplifier distortion model associated with the power amplifier, an identifier of a power amplifier model associated with the power amplifier, and/or one or more operating conditions associated with the power amplifier. A second indication indicating to operate the power amplifier according to a reduced power backoff and/or a reduced maximum power reduction is received 502 from the base station.

The functions and/or blocks described above by means of FIGS. 3-5 are in no absolute chronological order, and some of them may be performed simultaneously or in an order differing from the described one. Other functions and/or blocks may also be executed between them or within them.

A technical advantage provided by some exemplary embodiments is that they may improve the performance of the UE, as well as improve uplink coverage without increasing UE complexity. The offline learning scheme used by some exemplary embodiments may reduce consumption of radio resources and battery power, when compared to online learning schemes. In an online learning scheme for PA distortion compensation, the transmitter may first need to transmit a large number of reference signals, so that the receiver can train the machine learning model. However, in the offline learning scheme of some exemplary embodiments, the machine learning model is pre-trained, and thus there is no need for a full learning process.

Figure 6:
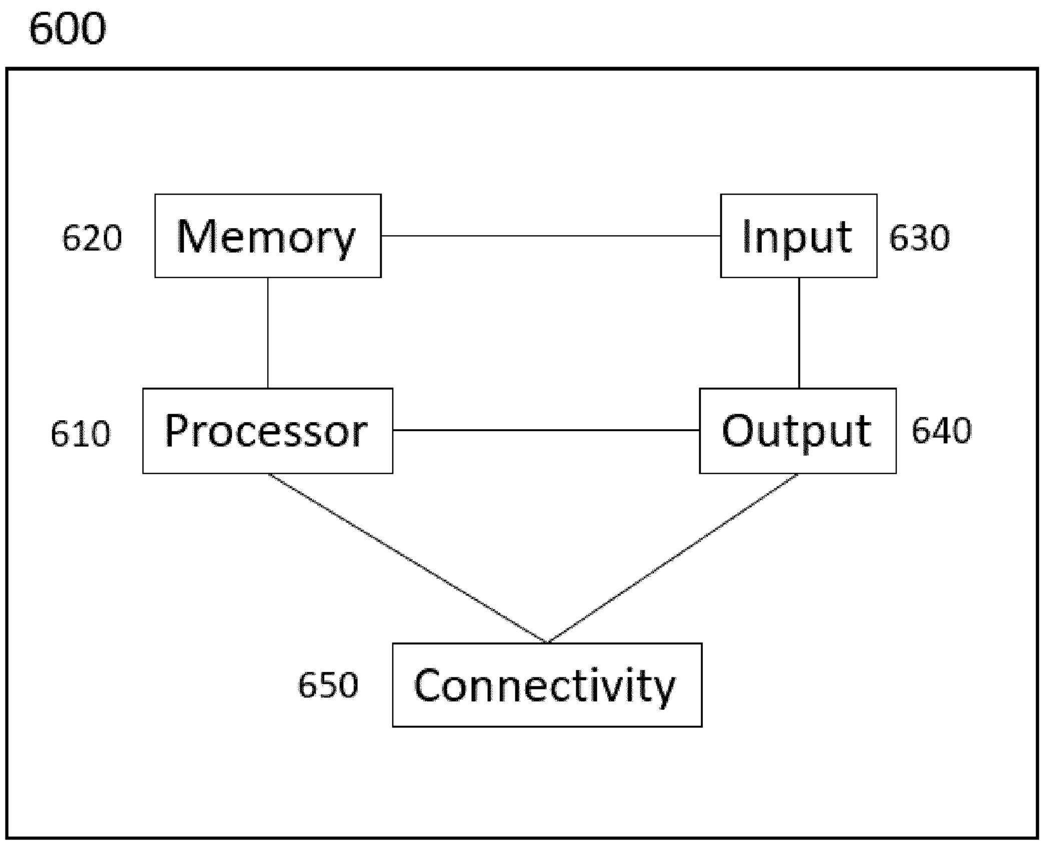
FIGS. 6-7 illustrate apparatuses according to some exemplary embodiments.

FIG. 6 illustrates an apparatus 600, which may be an apparatus such as, or comprised in, a terminal device, according to an exemplary embodiment. A terminal device may also be referred to as a UE or user equipment herein. The apparatus 600 comprises a processor 610. The processor 610 interprets computer program instructions and processes data. The processor 610 may comprise one or more programmable processors. The processor 610 may comprise programmable hardware with embedded firmware and may, alternatively or additionally, comprise one or more application-specific integrated circuits (ASICs).

The processor 610 is coupled to a memory 620. The processor is configured to read and write data to and from the memory 620. The memory 620 may comprise one or more memory units. The memory units may be volatile or non-volatile. It is to be noted that in some exemplary embodiments there may be one or more units of non-volatile memory and one or more units of volatile memory or, alternatively, one or more units of non-volatile memory, or, alternatively, one or more units of volatile memory. Volatile memory may be for example random-access memory (RAM), dynamic random-access memory (DRAM) or synchronous dynamic random-access memory (SDRAM). Non-volatile memory may be for example read-only memory (ROM), programmable read-only memory (PROM), electronically erasable programmable read-only memory (EEPROM), flash memory, optical storage or magnetic storage. In general, memories may be referred to as non-transitory computer readable media. The memory 620 stores computer readable instructions that are executed by the processor 610. For example, non-volatile memory stores the computer readable instructions and the processor 610 executes the instructions using volatile memory for temporary storage of data and/or instructions.

The computer readable instructions may have been prestored to the memory 620 or, alternatively or additionally, they may be received, by the apparatus, via an electromagnetic carrier signal and/or may be copied from a physical entity such as a computer program product. Execution of the computer readable instructions causes the apparatus 600 to perform one or more of the functionalities described above.

In the context of this document, a "memory" or "computer-readable media" or "computer-readable medium" may be any non-transitory media or medium or means that can contain, store, communicate, propagate or transport the instructions for use by or in connection with an instruction execution system, apparatus, or device, such as a computer.

The apparatus 600 may further comprise, or be connected to, an input unit 630. The input unit 630 may comprise one or more interfaces for receiving input. The one or more interfaces may comprise for example one or more temperature, motion and/or orientation sensors, one or more cameras, one or more accelerometers, one or more microphones, one or more buttons and/or one or more touch detection units. Further, the input unit 630 may comprise an interface to which external devices may connect to.

The apparatus 600 may also comprise an output unit 640. The output unit may comprise or be connected to one or more displays capable of rendering visual content, such as a light emitting diode (LED) display, a liquid crystal display (LCD) and/or a liquid crystal on silicon (LCoS) display. The output unit 640 may further comprise one or more audio outputs. The one or more audio outputs may be for example loudspeakers.

The apparatus 600 further comprises a connectivity unit 650. The connectivity unit 650 enables wireless connectivity to one or more external devices. The connectivity unit 650 comprises at least one transmitter and at least one receiver that may be integrated to the apparatus 600 or that the apparatus 600 may be connected to. The at least one transmitter comprises at least one transmission antenna, and the at least one receiver comprises at least one receiving antenna. The connectivity unit 650 may comprise an integrated circuit or a set of integrated circuits that provide the wireless communication capability for the apparatus 600. Alternatively, the wireless connectivity may be a hardwired application-specific integrated circuit (ASIC). The connectivity unit 650 may comprise one or more components such as a power amplifier, digital front end (DFE), analog-to-digital converter (ADC), digital-to-analog converter (DAC), frequency converter, (de)modulator, and/or encoder/decoder circuitries, controlled by the corresponding controlling units.

It is to be noted that the apparatus 600 may further comprise various components not illustrated in FIG. 6. The various components may be hardware components and/or software components.

Figure 7:
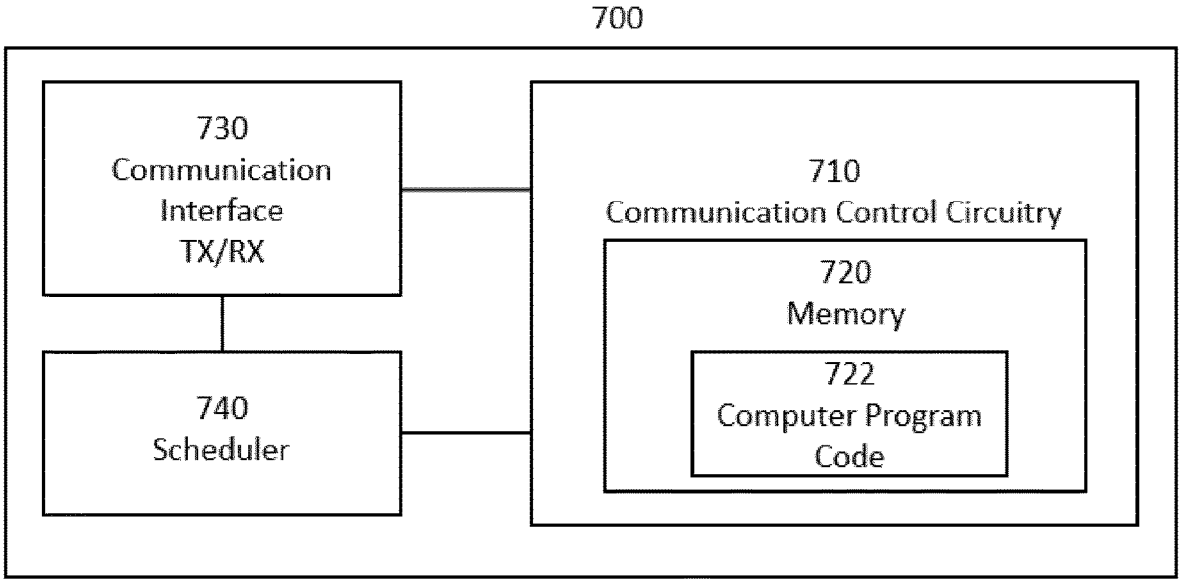

The apparatus 700 of FIG. 7 illustrates an exemplary embodiment of an apparatus such as, or comprised in, a base station such as a gNB. The apparatus may comprise, for example, a circuitry or a chipset applicable to a base station to realize some of the described exemplary embodiments. The apparatus 700 may be an electronic device comprising one or more electronic circuitries. The apparatus 700 may comprise a communication control circuitry 710 such as at least one processor, and at least one memory 720 including a computer program code (software) 722 wherein the at least one memory and the computer program code (software) 722 are configured, with the at least one processor, to cause the apparatus 700 to carry out some of the exemplary embodiments described above.

The memory 720 may be implemented using any suitable data storage technology, such as semiconductor-based memory devices, flash memory, magnetic memory devices and systems, optical memory devices and systems, fixed memory and/or removable memory. The memory may comprise a configuration database for storing configuration data. For example, the configuration database may store a current neighbour cell list, and, in some exemplary embodiments, structures of the frames used in the detected neighbour cells.

The apparatus 700 may further comprise a communication interface 730 comprising hardware and/or software for realizing communication connectivity according to one or more communication protocols. The communication interface 730 comprises at least one transmitter (TX) and at least one receiver (RX) that may be integrated to the apparatus 700 or that the apparatus 700 may be connected to. The communication interface 730 provides the apparatus with radio communication capabilities to communicate in the cellular communication system. The communication interface may, for example, provide a radio interface to terminal devices. The apparatus 700 may further comprise another interface towards a core network such as the network coordinator apparatus and/or to the access nodes of the cellular communication system. The apparatus 700 may further comprise a scheduler 740 that is configured to allocate resources.

As used in this application, the term "circuitry" may refer to one or more or all of the following: a) hardware-only circuit implementations (such as implementations in only analog and/or digital circuitry); and b) combinations of hardware circuits and software, such as (as applicable): i) a combination of analog and/or digital hardware circuit(s) with software/firmware and ii) any portions of hardware processor(s) with software (including digital signal processor(s)), software, and memory(ies) that work together to cause an apparatus, such as a mobile phone, to perform various functions); and c) hardware circuit(s) and/or processor(s), such as a microprocessor(s) or a portion of a microprocessor(s), that requires software (for example firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

The techniques and methods described herein may be implemented by various means. For example, these techniques may be implemented in hardware (one or more devices), firmware (one or more devices), software (one or more modules), or combinations thereof. For a hardware implementation, the apparatus(es) of exemplary embodiments may be implemented within one or more application-specific integrated circuits (ASICs), digital signal processors (DSPs), digital signal processing devices (DSPDs), programmable logic devices (PLDs), field programmable gate arrays (FPGAs), graphics processing units (GPUs), processors, controllers, micro-controllers, microprocessors, other electronic units designed to perform the functions described herein, or a combination thereof. For firmware or software, the implementation can be carried out through modules of at least one chipset (for example procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

It will be obvious to a person skilled in the art that, as technology advances, the inventive concept may be implemented in various ways. The embodiments are not limited to the exemplary embodiments described above, but may vary within the scope of the claims. Therefore, all words and expressions should be interpreted broadly, and they are intended to illustrate, not to restrict, the exemplary embodiments.

LIST OF ABBREVIATIONS

4G: fourth generation
5G: fifth generation
ACLR: adjacent channel leakage ratio
ADC: analog-to-digital converter
ASIC: application-specific integrated circuit
BBU: baseband unit
CMOS: complementary metal oxide semiconductor
CN: core network
CPS: cyber-physical system
CSSP: customer-specific standard product
CU: central unit
CU-CP: central unit control plane
CU-UP: central unit user plane
DAC: digital-to-analog converter
DCI: downlink control information
DFE: digital front end
DPD: digital predistortion
DRAM: dynamic random-access memory
DSP: digital signal processor
DSPD: digital signal processing device
DU: distributed unit
EEPROM: electronically erasable programmable read-only memory
EVM: error vector magnitude
FPGA: field programmable gate array
GEO: geostationary earth orbit
gNB: next generation nodeB/5G base station
GPU: graphics processing unit HNB-GW: home node B gateway
IAB: integrated access and backhaul
IBE: in-band emissions
IMS: internet protocol multimedia subsystem
IoT: internet of things
L1: Layer 1
L2: Layer 2
L3: Layer 3
LCD: liquid crystal display
LCOS: liquid crystal on silicon
LED: light emitting diode
LEO: low earth orbit
LSTM: long short term memory
LTE: long term evolution
LTE-A: long term evolution advanced
M2M: machine-to-machine
MAC: medium access control
MANET: mobile ad-hod network
MEC: multi-access edge computing
MIMO: multiple input and multiple output
MME: mobility management entity
mMTC: massive machine-type communications
MPR: maximum power reduction
MT: mobile termination
NGC: next generation core
NR: new radio
NVF: network function virtualization
OBO: output backoff
OCB: occupied channel bandwidth
OFDM: orthogonal frequency-division multiplexing
PA: power amplifier
PAE: power added efficiency
PAPR: peak-to-average power ratio
PCS: personal communications services
PDA: personal digital assistant
PDCP: packet data convergence protocol
P-GW: packet data network gateway
PHY: physical
PLD: programmable logic device
PROM: programmable read-only memory
PUSCH: physical uplink shared channel
QAM: quadrature amplitude modulation
RAM: random-access memory
RAN: radio access network
RAP: radio access point
RAT: radio access technology
RI: radio interface
RLC: radio link control
ROM: read-only memory
RRC: radio resource control
RU: radio unit
RX: receiver
SC-FDM: single-carrier frequency-division multiplexing
SDAP: service data adaptation protocol
SDN: software defined networking
SDRAM: synchronous dynamic random-access memory
S-GW: serving gateway
SIM: subscriber identification module
SoC: system-on-a-chip
TRX: transceiver
TX: transmitter
UE: user equipment
UMTS: universal mobile telecommunications system
UTRAN: UMTS radio access network
UWB: ultra-wideband
vCU: virtualized central unit
vDU: virtualized distributed unit
WCDMA: wideband code division multiple access
WiMAX: worldwide interoperability for microwave access
WLAN: wireless local area network

What is claimed is:

1. An apparatus comprising at least one processor, and at least one memory including computer program code, wherein the at least one memory and the computer program code are configured, with the at least one processor, to cause the apparatus to:
select a power amplifier distortion model from a set of power amplifier distortion models, wherein the power amplifier distortion model comprises a pre-trained machine learning model comprising an artificial neural network configured to compensate power amplifier distortion;
receive one or more uplink data transmissions from a terminal device; and
compensate at least a part of the power amplifier distortion from the one or more uplink data transmissions based at least partly on the power amplifier distortion model.

2. The apparatus according to claim 1, wherein the power amplifier distortion model is selected based at least partly on at least one of: an identifier of a power amplifier of the terminal device, an identifier of a power amplifier distortion model associated with the power amplifier, an identifier of a power amplifier model associated with the power amplifier, and/or one or more operating conditions indicated by the terminal device;
wherein the one or more operating conditions comprise at least one of: a frequency band, a temperature, a power supply voltage, and/or a bias voltage associated with the power amplifier of the terminal device.

3. The apparatus according to claim 1, wherein the apparatus is further caused to receive one or more first reference signals from the terminal device, wherein the one or more first reference signals comprise a pre-defined signal distorted by the power amplifier distortion.

4. The apparatus according to claim 3, wherein the power amplifier distortion model is selected based at least partly on the one or more first reference signals.

5. The apparatus according to claim 3, wherein the apparatus is further caused to:
evaluate the power amplifier distortion model based at least partly on the one or more first reference signals; and
based on the evaluating, adjust the power amplifier distortion model by re-training at least a part of the pre-trained machine learning model based at least partly on the one or more first reference signals.

6. The apparatus according to claim 1, wherein the apparatus is further caused to:
transmit, to the terminal device, an indication to operate according to a reduced power backoff and/or a reduced maximum power reduction.

7. The apparatus according to claim 1, wherein the apparatus is further caused to:
receive one or more second reference signals from the terminal device; and
adjust the power amplifier distortion model based at least partly on the one or more second reference signals.

8. An apparatus comprising at least one processor, and at least one memory including computer program code, wherein the at least one memory and the computer program code are configured, with the at least one processor, to cause the apparatus to:

transmit, to a base station, a first indication indicating a capability to support machine learning based power amplifier distortion compensation at the base station based on a pre-trained machine learning model comprising an artificial neural network;

wherein the first indication comprises at least one of: an identifier of a power amplifier comprised in the apparatus, an identifier of a power amplifier distortion model associated with the power amplifier, an identifier of a power amplifier model associated with the power amplifier, and/or one or more operating conditions associated with the power amplifier; and receive, from the base station, a second indication indicating to operate the power amplifier according to a reduced power backoff and/or a reduced maximum power reduction.

9. The apparatus according to claim 8, wherein the apparatus is further caused to:

receive, from the base station, an uplink grant indicating to transmit one or more uplink data transmissions; and transmit the one or more uplink data transmissions to the base station via the power amplifier according to the reduced power backoff and/or the reduced maximum power reduction.

10. The apparatus according to claim 8, wherein the one or more operating conditions comprise at least one of: a frequency band, a temperature, a power supply voltage, and/or a bias voltage associated with the power amplifier.

11. A method comprising:

selecting, by a base station, a power amplifier distortion model from a set of power amplifier distortion models, wherein the power amplifier distortion model comprises a pre-trained machine learning model comprising an artificial neural network configured to compensate power amplifier distortion;

receiving, by the base station, one or more uplink data transmissions from a terminal device; and compensating, by the base station, at least a part of the power amplifier distortion from the one or more uplink data transmissions based at least partly on the power amplifier distortion model.

12. The method according to claim 11, wherein the power amplifier distortion model is selected based at least partly on at least one of: an identifier of a power amplifier of the terminal device, an identifier of a power amplifier distortion model associated with the power amplifier, an identifier of a power amplifier model associated with the power amplifier, and/or one or more operating conditions indicated by the terminal device;

wherein the one or more operating conditions comprise at least one of: a frequency band, a temperature, a power supply voltage, and/or a bias voltage associated with the power amplifier of the terminal device.

13. The method according to claim 11, further comprising receiving one or more first reference signals from the terminal device, wherein the one or more first reference signals comprise a pre-defined signal distorted by the power amplifier distortion.

14. The method according to claim 13, wherein the power amplifier distortion model is selected based at least partly on the one or more first reference signals.

15. The method according to claim 13, further comprising:

evaluating the power amplifier distortion model based at least partly on the one or more first reference signals; and based on the evaluating, adjust the power amplifier distortion model by re-training at least a part of the pre-trained machine learning model based at least partly on the one or more first reference signals.

16. The method according to claim 11, further comprising:

transmitting, to the terminal device, an indication to operate according to a reduced power backoff and/or a reduced maximum power reduction.

17. The method according to claim 11, further comprising:

receiving one or more second reference signals from the terminal device; and adjusting the power amplifier distortion model based at least partly on the one or more second reference signals.

* * * * *